(12) United States Patent
Honda et al.

(10) Patent No.: US 8,490,802 B2
(45) Date of Patent: Jul. 23, 2013

(54) OVERHEAD CONVEYING VEHICLE

(75) Inventors: Noriaki Honda, Kyoto (JP); Takanori Izumi, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 379 days.

(21) Appl. No.: 12/993,290

(22) PCT Filed: May 14, 2009

(86) PCT No.: PCT/JP2009/002106
§ 371 (c)(1), (2), (4) Date: Nov. 18, 2010

(87) PCT Pub. No.: WO2009/141976
PCT Pub. Date: Nov. 26, 2009

(65) Prior Publication Data
US 2011/0062103 A1 Mar. 17, 2011

(30) Foreign Application Priority Data
May 22, 2008 (JP) ................................. 2008-134841

(51) Int. Cl.
*B66C 19/00* (2006.01)
(52) U.S. Cl.
USPC .......................................... 212/331; 212/330
(58) Field of Classification Search
USPC .................. 212/328, 330, 331, 332, 333, 312, 212/318, 319, 320–323, 324, 326, 327; 104/89, 104/122; 105/148; 414/626, 940
See application file for complete search history.

(56) References Cited

U.S. PATENT DOCUMENTS

| | | | |
|---|---|---|---|
| 5,558,483 A | 9/1996 | Masuda | |
| 7,210,589 B2 * | 5/2007 | Iizuka | 212/273 |
| 2006/0237525 A1 | 10/2006 | Sone | |
| 2008/0092769 A1 | 4/2008 | Izumi et al. | |

FOREIGN PATENT DOCUMENTS

| | | |
|---|---|---|
| CN | 1114283 A | 1/1996 |
| JP | 2004-277066 A | 10/2004 |
| JP | 2005-187175 A | 7/2005 |
| JP | 2006-298565 A | 11/2006 |
| JP | 2006-298566 A | 11/2006 |
| JP | 2008-100635 A | 5/2008 |

OTHER PUBLICATIONS

English translation of Official Communication issued in corresponding International Application PCT/JP2009/002106, mailed on Jan. 20, 2011.
Official Communication issued in International Patent Application No. PCT/JP2009/002106, mailed on Jul. 14, 2009.

* cited by examiner

*Primary Examiner* — Emmanuel M Marcelo
*Assistant Examiner* — Angela Caligiuri
(74) *Attorney, Agent, or Firm* — Keating & Bennett, LLP

(57) ABSTRACT

An overhead conveying vehicle is arranged to contain and convey a suspended FOUP including a lid that is removably provided on a side surface thereof. The overhead conveying vehicle includes a conveying vehicle body, a hoist mechanism, a lid drop preventing member, and a power transmitting mechanism. The hoist mechanism is provided at the conveying vehicle body and is arranged to raise and lower the FOUP. The lid drop preventing member is arranged in close proximity to a front surface of the lid. The power transmitting mechanism retracts the lid drop preventing member away from the front surface of the lid when the FOUP is being raised or lowered.

8 Claims, 7 Drawing Sheets

OVERHEAD CONVEYING VEHICLE

BACKGROUND OF THE INVENTION

1. Field of the Invention

The present invention relates to an overhead conveying vehicle, particularly to an overhead conveying vehicle arranged to convey a suspended article having a lid that is removably provided on a side surface thereof.

2. Description of the Related Art

An overhead conveying vehicle system including an overhead conveying vehicle arranged to travel along a traveling rail provided on a ceiling is conventionally used to carry articles in a cleanroom (e.g., in a semiconductor manufacturing plant), where dust production is a problem.

The overhead conveying vehicle includes a traveling section arranged to travel along the traveling rail, an article containing section arranged to contain an article, and a hoist capable of raising and lowering the article. The hoist has a chuck for clasping the article, a belt capable of moving the chuck up and down, and a belt driving mechanism that can reel out and wind in the belt.

An example of an article conveyed by the overhead conveying vehicle in a cleanroom is a FOUP (Front Opening Unified Pod). A FOUP is a wafer storage pod that can be sealed. FOUPs ensure the cleanness of wafers and enable the miniaturization that accompanies larger wafer sizes to be accommodated. A FOUP includes a cassette and a lid for closing an opening on a side of the cassette. The lid serves to prevent particles from entering the cassette and to position the wafers inside the cassette.

The overhead conveying vehicle travels with the FOUP having been raised by the hoist and placed in the containing section. When it comes in front of a manufacturing apparatus, the overhead conveying vehicle lowers the FOUP with the hoist and places the FOUP on a table of a load port. After the FOUP is placed onto the table, it is docked with the opening of the manufacturing apparatus. Then, a FOUP opener removes the lid from the cassette of the FOUP and pulls the lid into the apparatus. The wafers are then carried into the semiconductor manufacturing apparatus and a prescribed process is executed. After the process, the wafers are returned into the FOUP and the lid is put back to close the FOUP. The overhead conveying vehicle uses the hoist to hold the FOUP resting on the table of the load port of the manufacturing apparatus and raise the FOUP to a containment position. The overhead conveying vehicle then contains the FOUP and starts traveling. In this way, the overhead conveying vehicle moves the FOUP between load ports.

With an overhead conveying vehicle system, there are times when automatic guide vehicles pass under the traveling rail and when workers move and work under the rail. If the lid drops from the FOUP at such a time, the worker could be injured or another device could be damaged. Therefore, a configuration in which a lid drop preventing member is provided on the overhead conveying vehicle has been proposed (e.g., see Japanese Laid-open Patent Publication No. 2004-277066 (U.S. Pat. No. 3,885,232)).

The lid drop preventing member presented in Japanese Laid-open Patent Publication No. 2004-277066 (U.S. Pat. No. 3,885,232) is fastened to a hoist chuck such that it can move sideways with the hoist chuck, but cannot move in another direction. Consequently, there is a possibility that the hoist chuck or the FOUP will be in contact with the lid drop preventing member when the FOUP is lowered from the containment position or moved upward from a loading port. In particular, when the FOUP rocks while being raised, the FOUP can easily collide against the lid drop preventing member. If such a collision occurs, the overhead conveying vehicle will shake and the wafers inside the FOUP will undergo a physical shock due to the shaking. It is also possible for the shaken traveling vehicle to strike another traveling vehicle.

SUMMARY OF THE INVENTION

In order to overcome the problems described above, preferred embodiments of the present invention provide an overhead conveying vehicle in which a conveyed article is in most cases prevented from colliding against a lid drop preventing member when the article is raised and lowered.

An overhead conveying vehicle according to a preferred embodiment of the present invention is an overhead conveying vehicle arranged to contain and convey a suspended article having a lid that is removably provided on a side surface thereof. The overhead conveying vehicle includes a conveying vehicle body, a hoist mechanism, a lid drop preventing mechanism, and a first retracting mechanism. The hoist mechanism is provided at the conveying vehicle body and can hoist an article. The lid drop preventing mechanism is arranged in close proximity to a front surface of the lid. The first retracting mechanism retracts the lid drop preventing member from the front surface of the lid when an article is being raised or lowered.

With this overhead conveying vehicle, the lid drop preventing member is arranged in close proximity to the front surface of the lid when the conveying vehicle body is conveying a suspended article. Therefore, it is difficult for the lid to drop down even if the lid separates from the article. When the conveying vehicle body is stopped and the hoist mechanism raises or lowers the article, the first retracting mechanism retracts the lid drop preventing member from the front surface of the lid. As a result, the article does not readily or easily collide against the lid drop preventing member when the article is raised or lowered, such that the article is prevented from colliding with the lid drop preventing member in most cases.

The overhead conveying vehicle preferably includes an article drop preventing member, a second retracting mechanism, and a drive mechanism. The article drop preventing member is arranged below an article containment position. The second retracting mechanism retracts the article drop preventing member from below the article containment position when the article is raised or lowered. The drive mechanism drives both the first retracting mechanism and the second retracting mechanism.

With this overhead conveying vehicle, the article drop preventing member is arranged below the article containment position when the conveying vehicle body is conveying a suspended article. Therefore, it is difficult for the article to drop down even if the article separates from the hoist mechanism. Meanwhile, when the conveying vehicle body is stopped and the hoist mechanism raises or lowers the article, the second retracting mechanism retracts the article drop preventing member from underneath the article. As a result, the article is not likely to collide against the article drop preventing member such that the article is prevented from colliding with the drop preventing member in most cases.

Furthermore, since the drive mechanism drives both the first retracting mechanism and the second retracting mechanism, it is not necessary to use a plurality of power sources.

It is preferable for the lid drop preventing member to be a member that can turn between a drop preventing position and a waiting position thereof and the article drop preventing member to be a member that can turn between a drop preventing and a waiting position thereof.

With this overhead conveying vehicle, the lid and the article can be more reliably prevented from dropping because the lid drop preventing member and the article drop preventing member can turn.

The first retracting mechanism and the second retracting mechanism are preferably connected through a power transmitting section that changes a rotation direction between the first retracting mechanism and the second retracting mechanism.

With this overhead conveying vehicle, the first retracting mechanism and the second retracting mechanism can be driven by a common power source because they are connected together through the power transmitting section. As a result, the first retracting mechanism and the second retracting mechanism can be driven using a smaller number of components.

The power transmitting section preferably includes a first shaft provided at a turning center of the lid drop preventing member, a second shaft provided at a turning center of the article drop preventing member, and a pair of bevel gears connecting the first shaft and the second shaft.

With this overhead conveying vehicle, a drive force is transmitted from the first shaft to the second shaft through the pair of bevel gears.

The lid drop preventing member preferably includes a pair of drop preventing members arranged to be separate in a vertical direction. The drive mechanism preferably includes a rotary drive section and a link mechanism including a pair of link members arranged to transmit a drive force from the rotary drive section to the pair of drop preventing members.

With this overhead conveying vehicle, both drop preventing members of the pair preferably are driven simultaneously by the link mechanism.

With an overhead conveying vehicle according to a preferred embodiment of the present invention, when the conveying vehicle body is stopped and the hoist mechanism is raising or lowering the article, the first retracting mechanism retracts the lid drop preventing member away from the front surface of the lid. As a result, the article does not collide against the lid drop preventing member in most cases when the article is being raised or lowered.

The above and other elements, features, steps, characteristics and advantages of the present invention will become apparent from the following detailed description of the preferred embodiments with reference to the attached drawings.

DETAILED DESCRIPTION OF THE PREFERRED EMBODIMENTS

Preferred embodiments of the present invention will now be explained with reference to the drawings.

(1) Overhead Traveling Vehicle System

Figure 1:
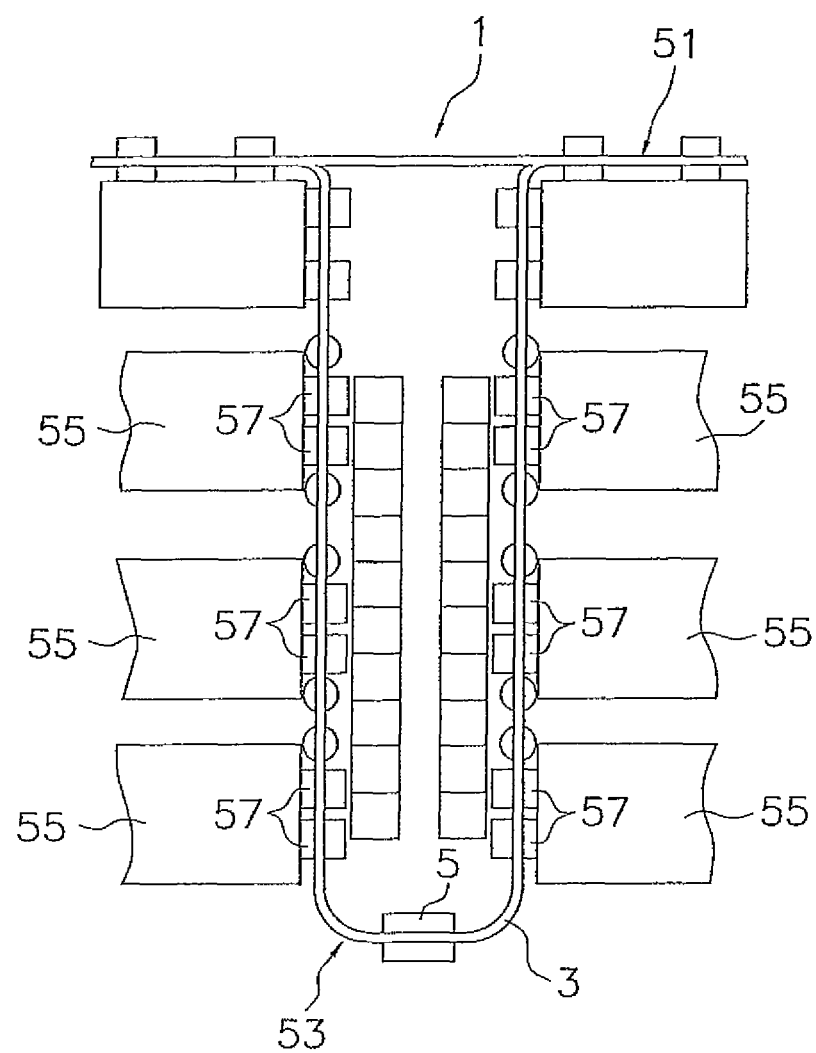
FIG. 1 is a simple schematic view of an overhead traveling vehicle system inside a cleanroom.

FIG. 1 is a simplified view of an overhead traveling vehicle system 1 preferably using a non-contact electric power supply method using a feeder line. The overhead traveling vehicle system 1 is preferably provided in a cleanroom of a semiconductor plant or the like, for example, and is arranged to convey a FOUP (Front Opening Unified Pod) (explained later). The overhead traveling vehicle system 1 includes a rail 3 and an overhead traveling vehicle 5 that travels along the rail 3.

The structure of the inside of a semiconductor plant will now be explained. The semiconductor plant has a plurality of bays (processes). An inter-bay route 51 is provided to connect bays that are remote from each other and an intra-bay route 53 is provided in each bay. The routes 51 and 53 preferably include a rail 3.

A plurality of processing devices 55 arranged to process semiconductors and the like are arranged along the intra-bay routes 53. Additionally, load ports 57 are provided near the processing devices 55. The load ports 57 are provided directly below the intra-bay route 53. Thus, the overhead traveling vehicle 5 travels along the rail 3 and transports a FOUP (explained later) between the load ports 57.

(2) Rail

Figure 2:
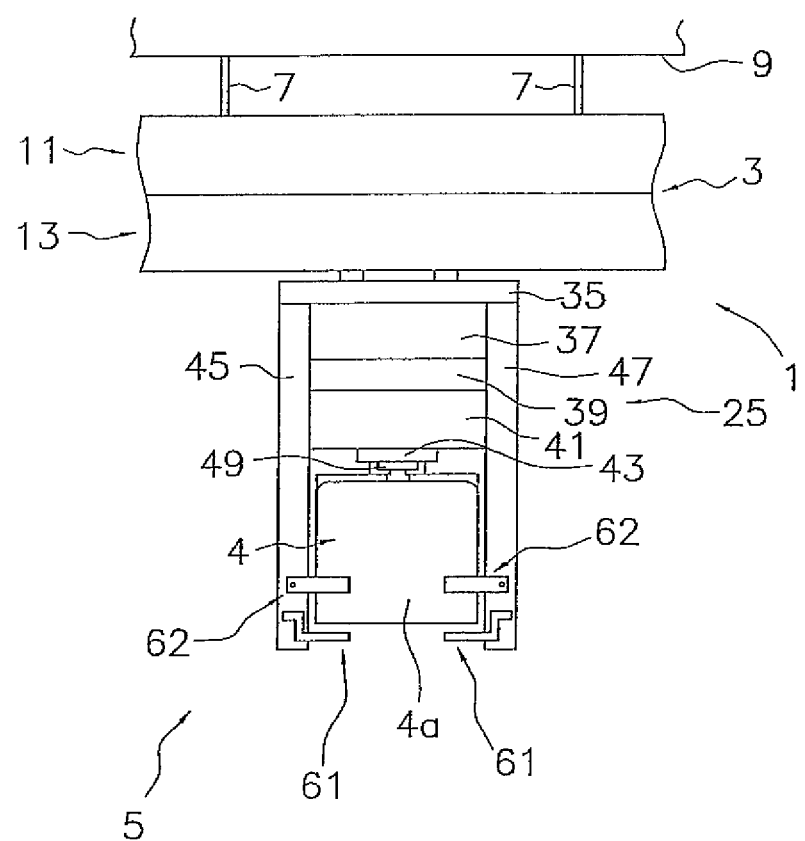
FIG. 2 is a partial side view of an overhead traveling vehicle system and an overhead traveling vehicle.

As shown in FIG. 2, the rail 3 is suspended from a ceiling 9 with a plurality of columns 7. The rail 3 preferably includes a traveling rail 11 and an electric power supply rail 13 provided at a bottom portion of the traveling rail 11.

(a) Traveling Rail

Figure 3:
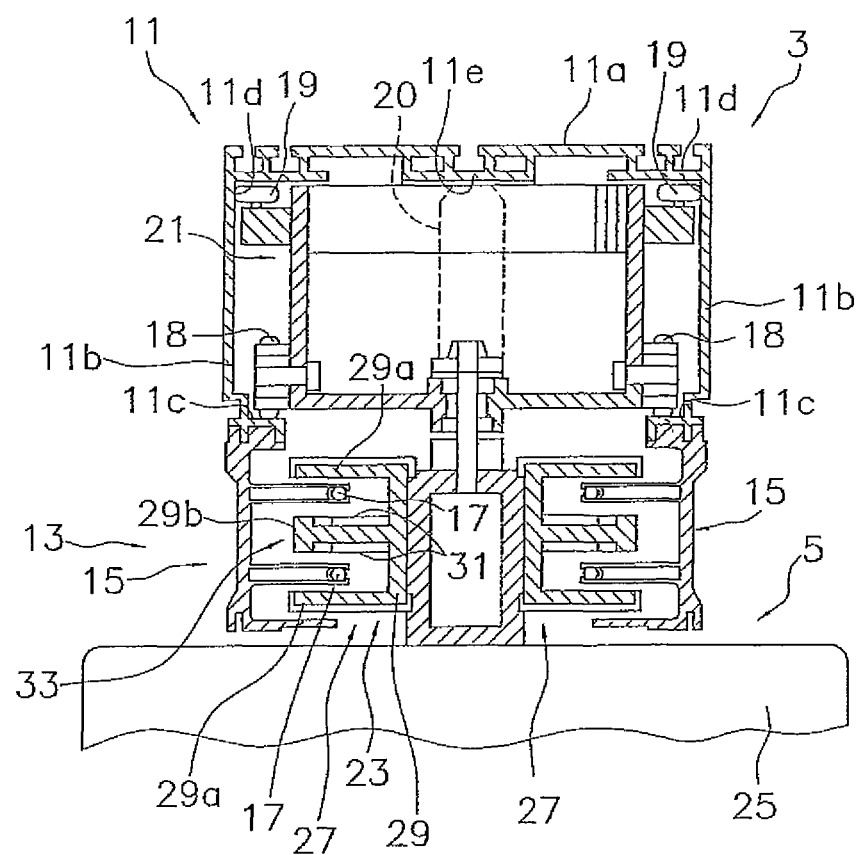
FIG. 3 is a vertical cross sectional schematic view of the inside of a rail.

The traveling rail 11 preferably is made of, for example, aluminum. As shown in FIG. 3, the traveling rail 11 is shaped like an inverted U in a cross sectional view and has an upper surface section 11a and two side surface sections 11b. A pair of inwardly extending first traveling surfaces 11c is provided below the side surface sections 11b. A second traveling surface 11d is provided on an inside surface of an upper portion of each of the side surface sections 11b, and a third traveling surface 11e is provided on a bottom surface of the upper surface section 11a.

(b) Electric Power Supply Rail

The electric power supply rail 13 preferably includes a pair of feeder line holders 15 and 15 provided on both sides of a lower portion of the traveling rail 11. Arranged at the feeder line holders 15 and 15 is a pair of feeder lines 17 and 17, each including a litz wire preferably made of a copper wire or other conductive wire covered with an insulating material. An electric power supply device (not shown) is provided at one end of a feeder line 17 and serves as a supply of high-frequency electric current to the pair of feeder lines 17 and 17.

(3) Overhead Traveling Vehicle

The overhead traveling vehicle 5 includes a traveling section 21, an electric power receiving section 23, and a hoist driving section 25. The traveling section 21 is a mechanism arranged inside the traveling rail 11 to travel along the rail 3. The electric power receiving section 23 is a mechanism arranged inside the electric power supply rail 13 to receive electric power from the pair of feeder lines 17 and 17. The hoist driving section 25 is a mechanism arranged below the electric power supply rail 13 for holding and hoisting a FOUP 4 up and down.

(a) Traveling Section

The traveling section 21 is arranged inside the traveling rail 11 and includes a pair of first guide wheels 18 and 18, a pair of second guide wheels 19 and 19, a travel driving wheel 20, and a motor. The two first guide wheels 18 and 18 are arranged on respective sides of a lower portion of the traveling section 21 and rotatably supported on an axle extending in a left-and-right direction with respect to the travelling direction of the vehicle. The first guide wheels 18 and 18 are arranged on the first traveling surfaces 11c of the traveling rail 11.

The second guide wheels 19 and 19 are arranged on respective sides of an upper portion of the traveling section 21 and rotatably supported on an axle extending in a vertical direction. The second guide wheels 19 and 19 use the second traveling surfaces 11d of the traveling rail 11 as guide surfaces and prevent the position of the vehicle from drifting in a transverse direction (left-and-right direction as viewed in the travelling direction of the vehicle).

The travel driving wheel 20 is arranged in an approximate center of the traveling section 21 and is pressed against the third traveling surface 11e of the traveling rail 11 with a spring or other pressing members. The travel driving wheel 20 is driven with the motor. As a result, the overhead traveling vehicle 5 travels along the rail 3.

(b) Electric Power Receiving Section

The electric power receiving section 23 includes a pair of pickup units 27 to obtain electric power from the pair of feeder lines 17 and 17. More specifically, the pair of pickup units 27 and 27 are arranged transversely adjacent to each other inside the electric power supply rail 13. Each of the two pickup units 27 has an approximately E-shaped cross section and includes a core 29 made of ferrite and a pickup coil 31 wound around the core 29. The core 29 includes two protruding sections 29a and a middle protruding section 29b arranged in between. The pickup coil 31 is wound around the middle protruding section 29b.

The pair of feeder lines 17 and 17 held in a feeder line holder 15 are arranged between the middle protruding section 29b and the respective protruding sections 29a. When a high-frequency current is passed through the pair of feeder lines 17 and 17, a magnetic field is generated which acts on the pickup coil 31 and generates an induced current in the pickup coil 31. In this way, electric power is supplied from the pair of feeder lines 17 and 17 to the pickup unit 27 such that the travel motor is driven and electric power is supplied to control devices. The pair of feeder lines 17 and 17 of the electric power supply rail 13 and the electric power receiving section 23 of the overhead traveling vehicle 5 constitute a non-contact electric power supply section 33.

(c) Hoist Driving Section

As shown in FIG. 2, the hoist driving section (hoist) 25 preferably includes a main body frame 35, a lateral feeding section 37, a θ drive 39, a hoist body 41, and a hoist chuck 43.

The main body frame 35 is a member fixed to a bottom portion of the electric power receiving section 23. A frontward frame 45 and a rearward frame 47 are provided on front and rear sides of the main body frame 35. The frontward frame 45 and the rearward frame 47 are members that extend downward from the main body frame 35 such that the lateral feeding section 37, the θ drive 39, the hoist body 41, and the hoist chuck 43 are sandwiched in-between. The frontward frame 45 and the rearward frame 47 is a case that has a space inside. The case houses a FOUP drop preventing mechanism and a lid drop preventing mechanism (explained later) inside.

Figure 4:
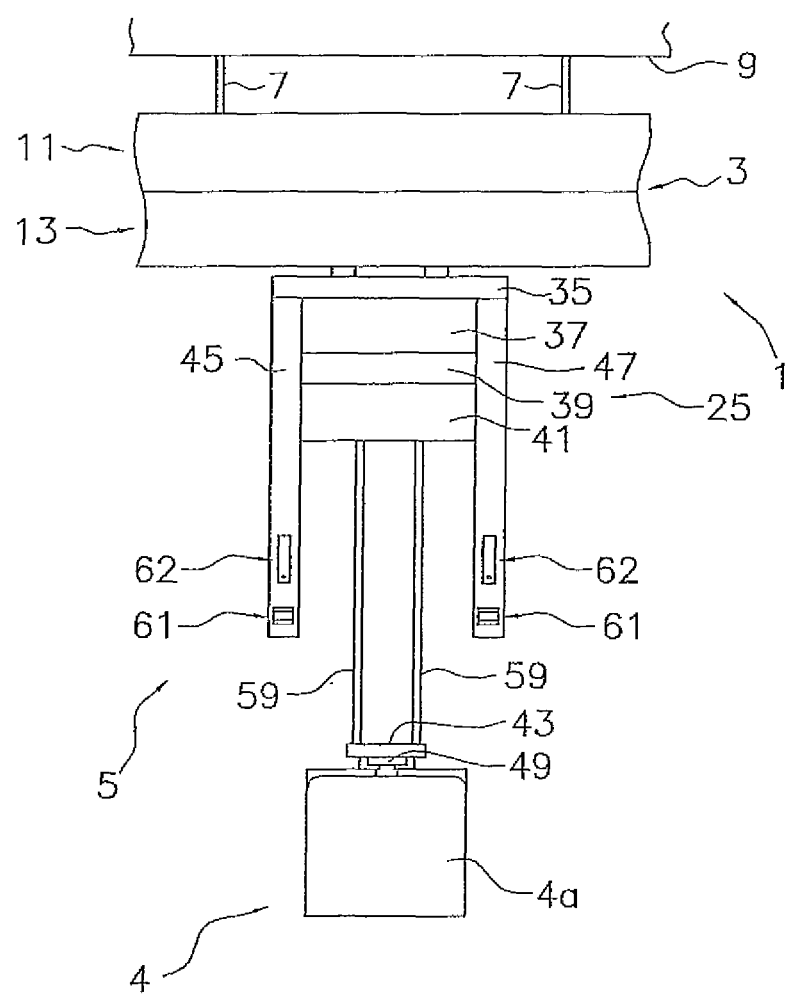
FIG. 4 is a partial side view of an overhead traveling vehicle system and an overhead traveling vehicle.

The lateral feeding section 37 feeds the θ drive 39, the hoist body 41, and the hoist chuck 43 in, for example, a sideway direction and can transfer a FOUP 4 to and from a side buffer (non shown) provided on a side of the rail 3. The θ drive 39 turns the hoist body 41 within a horizontal plane to make it easier to transfer a FOUP 4. A hoisting device (not shown) is provided inside the hoist body 41 to raise and lower the hoist chuck 43. The hoisting device includes, for example, four sets of winding drums and a belt 59 arranged around the winding drums. The hoist chuck 43 is attached to an end portion of the belt 59. FIG. 4 depicts a state in which the belt 59 has been reeled out from the drums such that the hoist chuck 43 is lowered along with a FOUP 4.

The FOUP 4 houses a plurality of semiconductor wafers inside and includes a removable lid 4a provided on a front surface thereof. A flange 49 is provided on an upper portion of the FOUP 4 and the flange 49 is held by the hoist chuck 43.

(4) FOUP Drop Preventing Mechanism

A FOUP drop preventing mechanism 58 will now be explained. The FOUP drop preventing mechanism 58 includes article drop preventing members 61 and drive mechanisms 60 that turn the article drop preventing members 61 between a drop preventing position and a retracted position.

As shown in FIG. 2 and FIG. 4, the article drop preventing members 61 arranged to prevent a FOUP 4 from dropping are arranged in frontward and rearward positions at bottom portions of the frontward frame 45 and the rearward frame 47. A pair of article drop preventing members 61 arranged to the left and right of each other is provided on each of the frontward frame 45 and the rearward frame 47. In FIG. 2, the FOUP 4 is arranged in a containment position and the article drop preventing members 61 are arranged in the drop preventing positions below the FOUP 4. In FIG. 4, the FOUP 4 has been moved downward from the containment position by the hoist body 41 and the article drop preventing members 61 have been retracted from underneath the FOUP 4 to the retracted positions.

Figure 6:
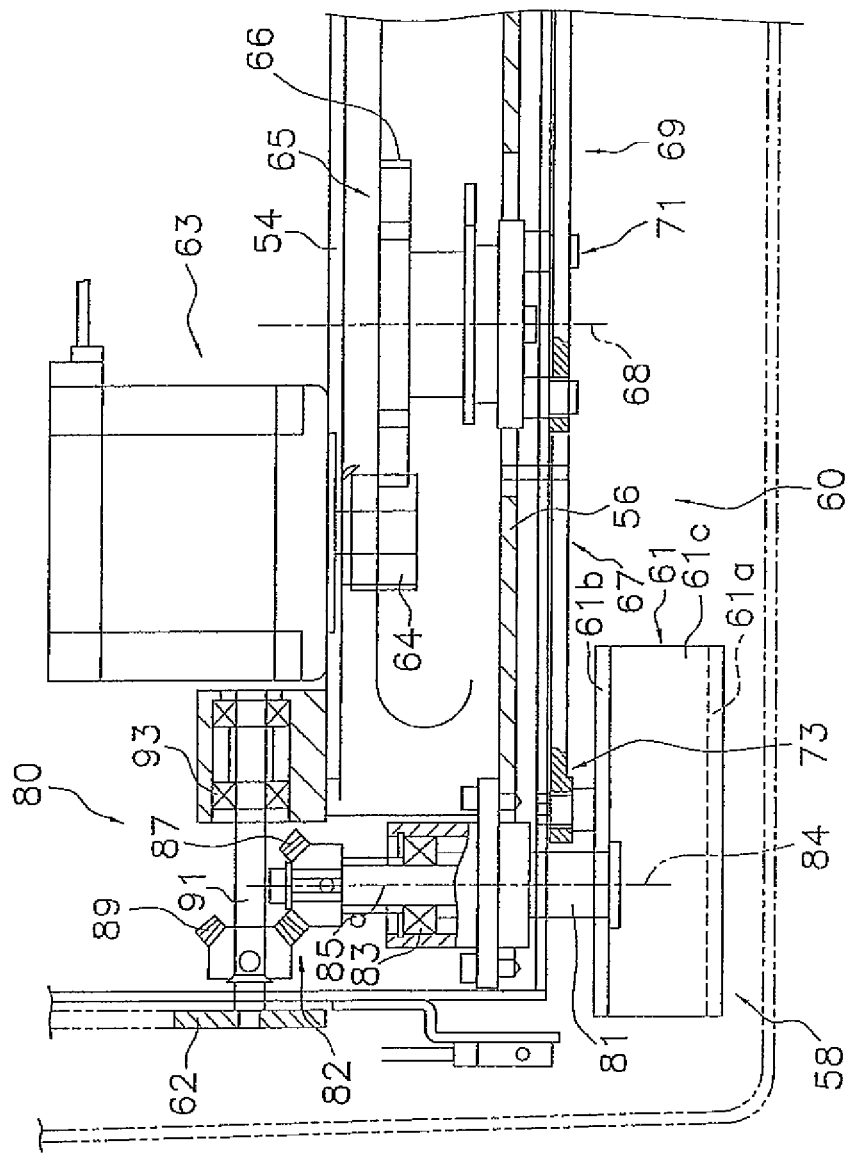
FIG. 6 is a vertical cross sectional schematic view of a lower portion of a drop preventing cover of an overhead traveling vehicle.
Figure 7:
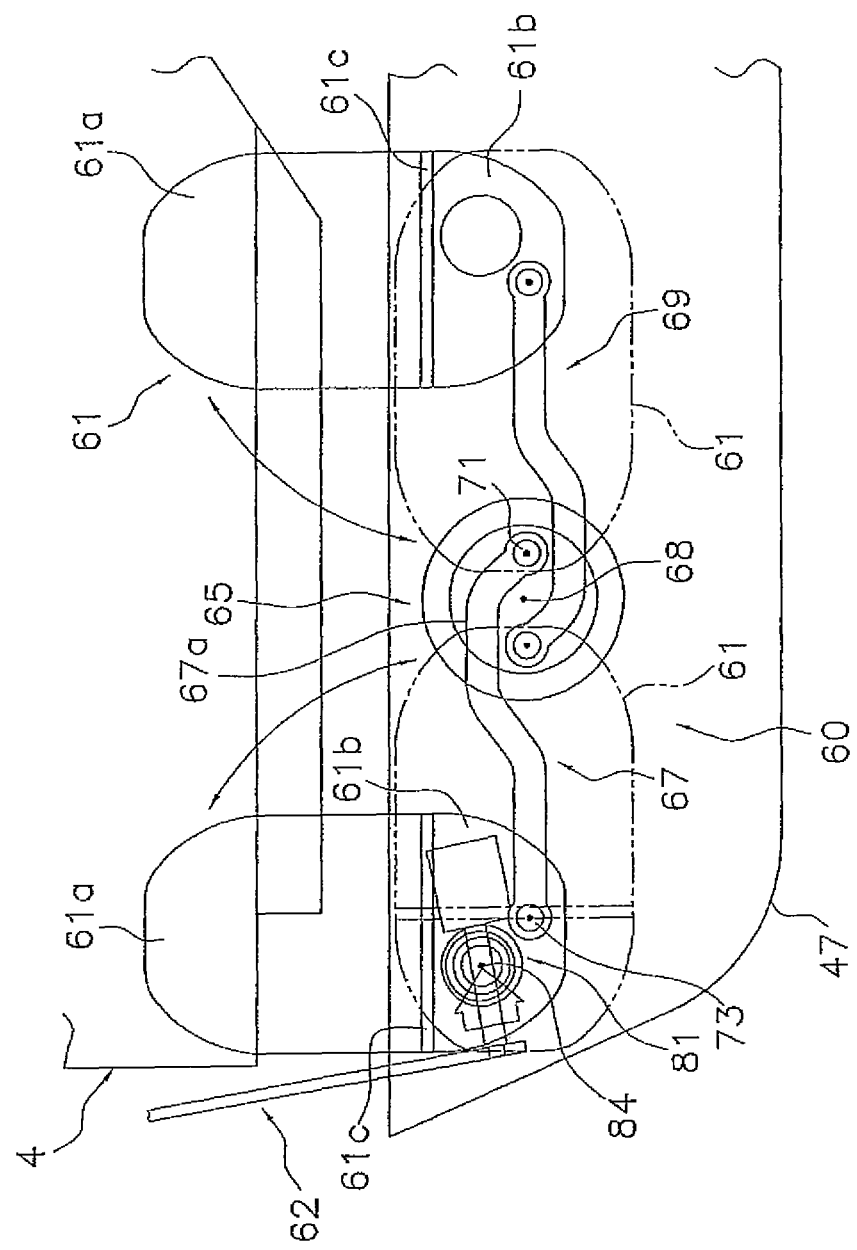
FIG. 7 is a schematic plan view of a drive mechanism.

The drive mechanisms 60 will now be explained with reference to FIGS. 5 to 7. Although a drive mechanism 60 is provided on each of the frontward frame 45 and the rearward frame 47, only the drive mechanism 60 provided on the rearward frame 47 will be explained here. In FIGS. 6 and 7, a direction oriented toward the left side of the figure is called a first lateral direction and a direction oriented toward the right side of the figure is called a second lateral direction. The right side in FIG. 5 and the bottom side in FIG. 7 correspond to a frontward conveyance direction, and the left side in FIG. 5 and the top side in FIG. 7 correspond to a rearward conveyance direction.

The drive mechanism 60 preferably includes a motor 63, a gear member 65, and link members 67 and 69. As shown in FIG. 6, the motor 63 is fixed to a first stationary plate 54 inside the rearward frame 47 and has a rotational axis that extends in a vertical direction with respect to the vehicle. A rotary shaft of the motor 63 protrudes downward and a gear 64 is provided at a tip end of the rotary shaft. The gear member 65 is a member rotatably supported on the first stationary plate 54 and includes a rotational axis 68 that extends parallel to the rotational axis of the motor 63. A gear 66 is provided on an upper portion of the gear member 65, and the gear 66 meshes with the gear 64 of the motor 63.

The link mechanisms 67 and 69 constitute a link mechanism to drive the article drop preventing members 61 and 61. Since the constituent features and operation of the link members 67 and 69 are the same, only the link member 67 will now be explained.

The link member 67 is a member arranged to turn an article drop preventing member 61 in response to rotation of the gear member 65. As shown in FIG. 7, the link member 67 is an elongated plate-shaped member extending in a lateral direction and having one end rotatably connected to a first support section 71 of the gear member 65 and the other end rotatably supported on a second support section 73 of the article drop preventing member 61. In FIG. 7, the first support section 71 is arranged opposite a support section of the link member 69, with the rotational axis 68 in between of the gear member 65. Therefore, the link member 67 includes a curved section 67a that curves rearwardly around the rotational axis 68 of the gear member 65 from the first support section 71.

The article drop preventing member 61 preferably includes a drop preventing section 61a, a rotational support section 61b, and a wall section 61c that connects those two sections. The drop preventing section 61a is a plate member that extends in a horizontal direction and is comparatively long. The corners of the drop preventing section 61a are chamfered and smoothened. The rotational support section 61b is arranged at a position higher than the drop preventing section 61a and includes a plate member that extends in a horizontal direction. A shaft 81 is fixed to the rotational support section 61b and the shaft 81 is rotatably supported on a second stationary plate 56 of the rearward frame 47 such that it can rotate about a rotational axis 84. The shaft 81 is positioned slightly off a vertical centerline of the article drop preventing member 61 in a left-and-right direction. As a result, the article drop preventing member 61 can turn between a drop preventing position depicted with a solid line in FIG. 7 and a retracted position depicted with a double-dot chain line.

The structure and operation of the link member 69 and the link member 67 are point-symmetric with respect to the rotational axis 68.

(5) Lid Drop Preventing Mechanism

A lid drop preventing mechanism 80 will now be explained. The lid drop preventing mechanism 80 preferably includes lid drop preventing members 62 and a power transmitting mechanism 82.

As shown in FIG. 2 and FIG. 4, the lid drop preventing members 62 to prevent a lid 4a of a FOUP 4 from dropping are arranged in frontward and rearward positions on bottom portions of the frontward frame 45 and the rearward frame 47. One lid drop preventing member 62 is provided on each of the frontward frame 45 and the rearward frame 47. In FIG. 2, the FOUP 4 is arranged in the containment position and the lid drop preventing members 62 are arranged in drop preventing positions at a front surface of the lid 4a of the FOUP 4. In FIG. 4, the FOUP 4 has been moved downward from the containment position by the hoist body 41 and the lid drop preventing members 62 have been retracted from the front surface of the lid 4a of the FOUP 4 to retracted positions.

The power transmitting mechanism 82 is a mechanism to transmit a drive force from the drive mechanism 60 of the aforementioned FOUP drop preventing mechanism 58 to the lid drop preventing members 62. The power transmitting mechanism 82 preferably includes a first shaft 85, a first bevel gear (bevel gear) 87, a second bevel gear 89, and a second shaft 91. The first shaft 85 is integral with or fixed to the shaft 81 of the drive mechanism 60 such that it can rotate together therewith. The first shaft 85 is rotatably supported on a bearing 83 and extends in a direction opposite of the shaft 81. The first bevel gear 87 is fixed to a tip end of the first shaft 85. As a result, the rotational center of the first bevel gear 87 coincides with the rotational axis 84 of the first shaft 85. The second bevel gear 89 meshes with a laterally outside portion of the first bevel gear 87. In this state, the rotational axis of the second bevel gear 89 extends perpendicularly to the rotational axis 84 of the first bevel gear 87. Thus, the meshing of the first bevel gear 87 and the second bevel gear 89 converts the direction of rotation. The second shaft 91 is fixed to the second bevel gear 89. A laterally inside end (end oriented in second lateral direction) of the second shaft 91 is rotatably supported on a bearing 93 and a laterally outside end (end oriented in first lateral direction) is fixed to the second bevel gear 89. Additionally, a lid drop preventing member 62 is fixed to a protruding tip of the laterally outside end. As shown in FIG. 5, in the drop preventing position, the lid drop preventing member 62 extends in a lateral direction and a portion spanning from an intermediate position to a tip end protrudes from the rearward frame 47 so as to be in close proximity to a front surface of the lid 4a of the FOUP 4. As shown in FIG. 2, the lid drop preventing member 62 is arranged in a position corresponding to a lower portion (portion lower than a vertical center) of the lid 4a. Due to the operation described above, the lid drop preventing member 62 can turn between a drop preventing position depicted with a solid line in FIG. 5 and a retracted position depicted with a double-dot chain line. As is clear in FIG. 7, the direction in which the second shaft 91 extends is diagonal with respect to a lateral direction (i.e., not perpendicular to a longitudinal direction) and, consequently, the lid drop preventing member 62, too, is tilted such that a tip end thereof is positioned farther outward in the lateral direction (first lateral direction) than a base end. However, in another preferred embodiment, it is acceptable for the second shaft to extend in a direction parallel to the lateral direction such that the lid drop preventing member is parallel to the longitudinal direction.

Figure 5:
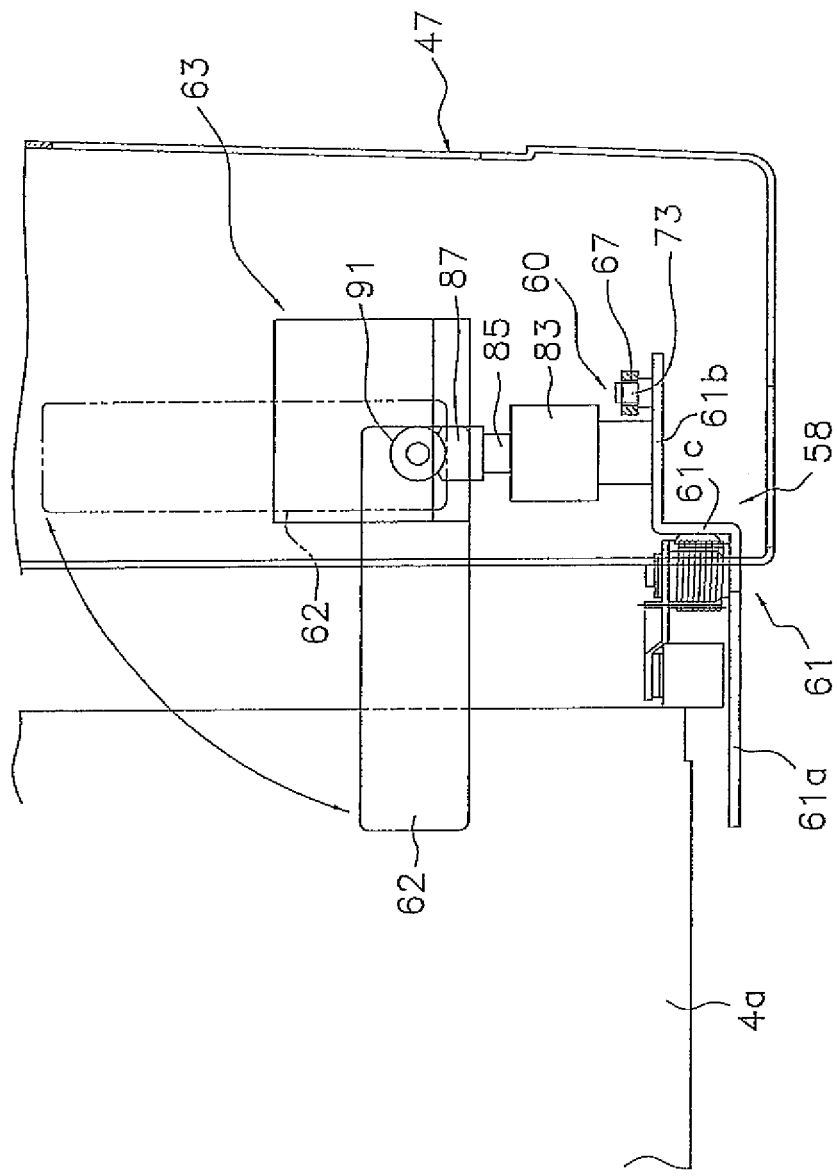
FIG. 5 is a vertical cross sectional schematic view of a lower portion of a drop preventing cover of an overhead traveling vehicle.

(6) Operation of FOUP Drop Preventing Mechanism and Lid Drop Preventing Mechanism When the overhead traveling vehicle 5 is carrying a FOUP 4, the article drop preventing member 61 is in a drop preventing position as shown in FIG. 7 and the lid drop preventing member 62 is in a drop preventing position as shown in FIG. 5. Consequently, when, for example, a FOUP 4 detaches from a chuck mechanism of the hoist table 43 or the lid 4a detaches from a cassette of a FOUP 4, the detached item is not likely to fall. In this way, the FOUP 4 and the lid 4a can be prevented from falling and a restriction prohibiting a work vehicle from entering an area underneath the rail 3 is not needed. As a result, a cleanroom can be utilized effectively.

In this state, as shown in FIG. 7, the gear member 65 of the drive mechanism 60 is rotated as far as possible in a clockwise direction and the first support section 71 is arranged toward the second lateral direction from the rotational axis of the gear member 65. The second support section 73 is arranged in front of and to the second lateral direction side of the rotational axis 84. When the motor 63 operates and the gear member 65 rotates counterclockwise, a force is transmitted from the gear member 65 to the article drop preventing member 61 through the link member 67. More specifically, the link member 67 exerts a force against the second support section 73 such that the article drop preventing member 61 turns clockwise about the rotational axis 84. As a result, the article drop preventing member 61 turns from the drop preventing position to the retracted position.

Also, due to the operation just described, when the article drop preventing member 61 turns clockwise about the rotational axis 84, the shaft 81 and the first shaft 85 rotate. As a result, the second shaft 91 rotates due to the meshing of the first bevel gear 87 and the second bevel gear 89 and the lid drop preventing member 62 turns from the drop preventing position indicated with the solid line to the retracted position indicated with the double-dot chain line.

When the mechanism is operated in the opposite manner of that just described, the article drop preventing member 61 turns from the retracted position to the drop preventing position and the lid drop preventing member 62 turns from the retracted position to the drop preventing position.

As explained previously, the article drop preventing member 61 and the lid drop preventing member 62 move between the drop preventing position and the retracted position with the same timing.

(7) Effects of FOUP Drop Preventing Mechanism and Lid Drop Preventing Mechanism As explained previously, a lid drop preventing member 62 and a power transmitting mechanism 82 are provided in a preferred embodiment of the present invention. The lid drop preventing member 62 is arranged in close proximity to a front surface of the lid 4a. The power transmitting mechanism 82 retracts the lid drop preventing members 62 from the front surface of the lid 4a when the FOUP 4 is being raised or lowered. With this overhead conveying vehicle 5, the lid drop preventing member 62 is arranged in close proximity to the front surface of the lid 4a when a suspended FOUP 4 is being conveyed. Consequently, the lid 4a is not likely to fall even if the lid 4a comes off the FOUP 4. Meanwhile, when the hoist driving section 25 raises or lowers the FOUP 4 while the overhead traveling vehicle 5 is stopped, the power transmitting mechanism 82 retracts the lid drop preventing members 62 from the front surface of the lid 4a. As a result, when it is raised or lowered, the FOUP 4 does not readily collide against the lid drop preventing members 62, such that the FOUP 4 is prevented from colliding with the lid drop preventing members 62 in most cases. In particular, even if the FOUP 4 shakes while being raised, the FOUP 4 will not likely collide against the lid drop preventing members 62. As a result, the wafers inside the FOUP 4 are not likely to experience any physical shock due to shaking caused by the collision.

The overhead traveling vehicle 5 has an article drop preventing member 61 and a drive mechanism 60. The article drop preventing member 61 is arranged below a containment position of the FOUP 4. The drive mechanism 60 retracts the article drop preventing member 61 from underneath the containment position of the FOUP 4 when the FOUP 4 is being raised or lowered. The drive mechanism 60 has a motor 63 serving as a drive source and a gear member 65 and link member 67 for driving the article drop preventing members 61. The gear member 65 and the link member 67 also transmit the power of the motor 63 to the power transmitting mechanism 82. With this overhead conveying vehicle 5, the article drop preventing member 61 is arranged below the article containment position of the FOUP 4 when a suspended FOUP 4 is being conveyed. Thus, the FOUP 4 is not likely to fall even if it separates from the hoist driving section 25. Meanwhile, when the hoist driving section 25 raises or lowers the FOUP 4 while the overhead traveling vehicle 5 is stopped, the drive mechanism 60 retracts the article drop preventing members 61 from underneath the FOUP 4. As a result, when it is raised or lowered, the FOUP 4 does not readily collide against the article drop preventing members 61. In particular, even if the FOUP 4 shakes while being raised, the FOUP 4 will not likely collide against the article drop preventing members 61. Thus, the FOUP 4 is prevented from colliding with the article drop preventing members 61 in most cases. As a result, the wafers inside the FOUP 4 are not likely to experience any physical shock due to shaking caused by the collision.

The lid drop preventing members 62 are arranged on both sides of the FOUP 4 (in this preferred embodiment, the front and rear sides) and preferably include a pair of members that can turn between a drop preventing position and a retracted position. The article drop preventing members 61 are arranged on both sides of the FOUP 4 and preferably include a pair of members that can turn between a drop preventing position and a retracted position. In this preferred embodiment, a pair of article drop preventing members 61 arranged to the left and right of each other is provided on each of the frontward frame 45 and the rearward frame 47, but it is acceptable to provide one member on each of the frontward frame 45 and the rearward frame 47. With this overhead traveling vehicle 5, the lid 4a and the FOUP 4 can be more reliably prevented from dropping because lid drop preventing members 62 and article drop preventing members 61 are arranged on both sides of the article being conveyed.

The power transmitting mechanism 82 and the drive mechanism 60 are connected through the first bevel gear 87 and the second bevel gear 89, which serve to change the direction of rotation between the two mechanisms. In this overhead traveling vehicle 5, the power transmitting mechanism 82 and the power transmitting section of the drive mechanism 60 are driven by a common motor 63. As a result, the power transmitting mechanism 82 and the drive mechanism 60 can be driven with a smaller number of components.

The power transmitting mechanism 82 includes a first shaft 85 provided at a turning center of a lid drop preventing member 62, a second shaft 91 provided at a turning center of an article drop preventing member 61, and a first bevel gear 87 and a second bevel gear 89 connecting the first shaft 85 and the second shaft 91 together such that power can be transmitted in between. As a result, a drive force can be transmitted from the first shaft 85 to the second shaft 91 through the first bevel gear 87 and the second bevel gear 89.

The lid drop preventing members 62 preferably include a pair of members arranged to be separate in a vertical direction. The drive mechanism 60 includes a motor 63 and a link mechanism comprising a pair of link members 67 and 69 to transmit a drive force from the motor 63 to the pair of lid drop preventing members 62. As a result, both of the lid drop preventing members 62 are driven simultaneously through the link mechanism.

(8) Other Preferred Embodiments

Preferred embodiments of the present invention have been explained heretofore, but the present invention is not limited to the preferred embodiments described above. Various changes can be made without departing from the scope of the present invention.

Although, in the previously explained preferred embodiments, the present invention is explained using a traveling vehicle system inside a cleanroom of a semiconductor manufacturing plant, the present invention can also be employed in other types of plants.

Although in the preferred embodiments described above, the conveyed article preferably is a FOUP, it is acceptable for the article to be something else.

Preferred embodiments of the present invention can be applied widely to systems having an overhead traveling vehicle that travels along a path.

The invention claimed is:

1. An overhead conveying vehicle arranged to contain and convey a suspended article including a lid that is removably provided on a side surface thereof, comprising:
   a conveying vehicle body;
   a hoist mechanism provided at the conveying vehicle body and capable of raising and lowering the article;
   a lid drop preventing member arranged near a front surface of the lid;
   a first retracting mechanism arranged to retract the lid drop preventing member away from the front surface of the lid when the article is being raised or lowered;
   an article drop preventing member arranged below a containment position of the article; and
   a second retracting mechanism arranged to retract the article drop preventing member from underneath the containment position of the article when the article is being raised or lowered; wherein
   the first retracting mechanism and the second retracting mechanism are connected through a power transmitting section; and
   the power transmitting section includes a first shaft provided at a turning center of the lid drop preventing member, a second shaft provided at a turning center of the article drop preventing member, and a bevel gear connecting the first shaft and the second shaft.

2. The overhead conveying vehicle of claim 1, further comprising:
   a drive mechanism arranged to drive both the first retracting mechanism and the second retracting mechanism.

3. The overhead conveying vehicle of claim 2, wherein the lid drop preventing member is a member that is movable between a drop preventing position and a retracted position thereof; and
   the article drop preventing member is a member that is movable between a drop preventing position and a retracted position thereof.

4. The overhead conveying vehicle of claim 3, wherein the power transmitting section transforms a rotation direction of one of the first retracting mechanism and the second retracting mechanism into a rotation direction of the other of the first retracting mechanism and the second retracting mechanism.

5. The overhead conveying vehicle of claim 4, wherein the article drop preventing member includes a pair of drop preventing members arranged to be separate, and the drive mechanism includes a rotary drive section and a link mechanism including a pair of link members arranged to transmit a drive force from the rotary drive section to the pair of drop preventing members.

6. The overhead conveying vehicle of claim 3, wherein the article drop preventing member includes a pair of drop preventing members arranged to be separate, and the drive mechanism includes a rotary drive section and a link mechanism including a pair of link members arranged to transmit a drive force from the rotary drive section to the pair of drop preventing members.

7. The overhead conveying vehicle of claim 1, wherein the article drop preventing member includes a pair of drop preventing members arranged to be separate, and a drive mechanism includes a rotary drive section and a link mechanism including a pair of link members arranged to transmit a drive force from the rotary drive section to the pair of drop preventing members.

8. The overhead conveying vehicle of claim 2, wherein the article drop preventing member includes a pair of drop preventing members arranged to be separate, and the drive mechanism includes a rotary drive section and a link mechanism including a pair of link members arranged to transmit a drive force from the rotary drive section to the pair of drop preventing members.

* * * * *